(12) United States Patent
Xu et al.

(10) Patent No.: US 9,305,943 B2
(45) Date of Patent: Apr. 5, 2016

(54) ARRAY SUBSTRATE AND REPAIRING METHOD THEREOF AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Xiangyang Xu, Beijing (CN); Hui Wang, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 92 days.

(21) Appl. No.: 14/368,983

(22) PCT Filed: Oct. 9, 2013

(86) PCT No.: PCT/CN2013/084917
§ 371 (c)(1),
(2) Date: Jun. 26, 2014

(87) PCT Pub. No.: WO2014/194594
PCT Pub. Date: Dec. 11, 2014

(65) Prior Publication Data
US 2015/0108480 A1   Apr. 23, 2015

(30) Foreign Application Priority Data

Jun. 3, 2013   (CN) .......................... 2013 1 0216603

(51) Int. Cl.
| | | |
|---|---|---|
| *H01L 27/12* | (2006.01) | |
| *G09G 3/36* | (2006.01) | |
| *H01L 21/66* | (2006.01) | |
| *G02F 1/1345* | (2006.01) | |
| *G02F 1/1362* | (2006.01) | |

(52) U.S. Cl.
CPC .......... *H01L 27/124* (2013.01); *G02F 1/13452* (2013.01); *G02F 1/136259* (2013.01); *G09G3/36* (2013.01); *H01L 22/22* (2013.01); *G02F 2001/136263* (2013.01); *G02F 2001/136272* (2013.01); *G09G 2300/0426* (2013.01); *G09G 2330/08* (2013.01)

(58) Field of Classification Search
CPC ... H01L 27/124; H01L 22/22; G02F 1/13452; G02F 1/136259; G02F 2001/136263; G02F 2001/136272; G09G 3/36
See application file for complete search history.

(56) References Cited

U.S. PATENT DOCUMENTS

| | | | |
|---|---|---|---|
| 6,618,101 B1 | 9/2003 | Kim et al. | |
| 7,053,977 B2 * | 5/2006 | Chang ............... | G02F 1/136259 349/192 |
| 2006/0138426 A1 | 6/2006 | Yoo et al. | |
| 2008/0158127 A1 * | 7/2008 | Chang ............... | G02F 1/136259 345/93 |
| 2008/0278410 A1 * | 11/2008 | Yamashita ........... | G09G 3/3233 345/55 |
| 2010/0265424 A1 | 10/2010 | Chiu et al. | |

FOREIGN PATENT DOCUMENTS

| | | |
|---|---|---|
| CN | 100580509 C | 1/2010 |
| CN | 102650784 A | 8/2012 |

OTHER PUBLICATIONS

Second Chinese Office Action Appln. No. 201310216603.0; Dated Jul. 7, 2015.
International Search Report dated Feb. 28, 2014; PCT/CN2013/084917.
First Chinese Office Action Appln. No. 201310216603.0; Dated Feb. 23, 2015.
International Preliminary Report on Patentability issued Dec. 8, 2015; PCT/CN2013/084917.

* cited by examiner

*Primary Examiner* — Anne Hines
(74) *Attorney, Agent, or Firm* — Ladas & Parry LLP

(57) ABSTRACT

An array substrate, a repairing method thereof and a display device, wherein the array substrate includes: a plurality of gate lines and a plurality of data lines provided in a display region, gate lead lines provided in a non-display region and respectively connected to the gate lines and a gate driver IC, and data lead lines provided in the non-display region and respectively connected to the data lines and a data driver IC. The array substrate further includes: at least one first repairing line provided in a same layer as the gate lead lines, and at a position corresponding to a data lead line; and/or, at least one second repairing line provided in a same layer as the data lead lines, and at a position corresponding to a gate lead line.

19 Claims, 3 Drawing Sheets

ARRAY SUBSTRATE AND REPAIRING METHOD THEREOF AND DISPLAY DEVICE

TECHNICAL FIELD

Embodiments of the present invention relate to an array substrate and a repairing method thereof and a display device.

BACKGROUND

Thin film transistor liquid crystal displays (TFT-LCDs) have the characteristics of small volume, low power consumption, non-radiation and the like, and have occupied a predominant position in the current flat-plate display market. A TFT-LCD mainly includes a liquid crystal display panel, a timing controller, a driver integrated circuit (IC), and so on. The liquid crystal display panel of a TFT-LCD can include an array substrate and a color filter substrate that are disposed oppositely, as well as liquid crystal molecules that are disposed between the array substrate and the color filter substrate. In the display region of the array substrate, a plurality of gate lines and a plurality of data lines that are crisscrossed with each other, and a plurality of display units are formed; each display unit may include a TFT, through which the rotation of the liquid crystal molecules in the corresponding display unit can be controlled to achieve the display of images; and the driver IC of the TFT-LCD includes a data driver IC and a gate driver IC.

The gate driver IC transmits driving signals to the gate electrode of the TFT of each display unit through a gate line, so that each row of TFTs are controlled to be turned on and off; when the TFTs are turned on, the data driver IC transmits driving signals to the source electrodes of each column of TFTs through a data line to control the input voltage of the source electrode of the TFT of each display unit, to complete charging pixels, and then to realize display. The driving signals of the gate driver IC are transmitted to the gate lines in the display region through gate lead lines in the non-display region of the array substrate, and the driving signals of the data driver IC are transmitted to the data lines in the display region through the data lead lines in the non-display region of the array substrate. The gate lead lines and the data lead lines are collectively called as the display-region fan-out lines.

In the practical manufacturing process, the array substrate is usually prepared with a plurality of patterning processes, and each patterning process usually includes masking, exposing, developing, etching and stripping processes and so on, and is prone to damage the gate lead lines and the data lead lines that have been already prepared on the array substrate to produce a short circuit. Besides, the data lead lines of the array substrate are not protected by the color filter layer provided thereon but covered by a very thin insulating-protection layer (or passivation layer) and part of a UV sealant (a kind of sealant used for sealing an IC, which can be cured through ultraviolet (UV) light mainly), so the data lead lines are prone to suffer from scratches and corrosion to produce a disconnection. The gate lead lines and the data lead lines usually adopt single-layer metal wires, which cannot be repaired if damaged, so in this case, only the product obsolescence method can be adopted, which causes a larger waste and increases manufacturing costs.

SUMMARY

Embodiments of the present invention provide an array substrate, repairing method thereof and a display device so as to resolve the problem that gate lead lines and data lead lines cannot be repaired once damaged to cause a larger waste.

An embodiment of the present invention provides an array substrate, comprising a plurality of gate lines and a plurality of data lines disposed in a display region, gate lead lines disposed in a non-display region and respectively connected to the gate lines and a gate driver integrated circuit, data lead lines disposed in the non-display region and respectively connected to the data lines and a data driver integrated circuit, at least one first repairing line disposed in a same layer as the gate lead lines and at a position corresponding to a data lead line, and/or at least one second repairing line disposed in a same layer as the data lead line and at a position corresponding to a gate lead line.

For example, each first repairing line may correspond to one different data lead line.

Further, for example, two ends of each first repairing line may be disposed in a dangling state.

For example, each second repairing line may correspond to one different gate lead line.

Furthermore, for example, two ends of each second repairing line may be disposed in a dangling state.

For example, if the gate driver IC is disposed on the array substrate, the array substrate may further comprise: at least one peripheral layout gate PLG respectively connected to the gate driver IC and an external printed circuit board PCB; and at least one third repairing line disposed in a same layer as the data lead lines, and at a position corresponding to the PLG.

For example, each third repairing line may correspond to one different PLG.

Furthermore, for example, two ends of each third repairing line are disposed in a dangling state.

An embodiment of the present invention further provides a repairing method of an array substrate, comprising: when a certain data lead line of an array substrate is determined to be disconnected, respectively performing a laser dot fusion process at positions on the array substrate corresponding to two ends of a position of the data lead line where a disconnection occurs, so that a first repairing line corresponding to the data lead line and the data lead line are fused together, wherein the first repairing line and a gate lead line of the array substrate are disposed in a same layer and at a position corresponding to the data lead line; or, when a certain gate lead line of the array substrate is determined to be disconnected, respectively performing a laser dot fusion process at positions on the array substrate corresponding to two ends of a position of the gate lead line where a disconnection occurs, so that a second repairing line corresponding to the gate lead line and the gate lead line are fused together, wherein the second repairing line and the data lead line are disposed in a same layer and at a position corresponding to the gate lead line.

For example, the method may further comprise: if any one of the PLGs of the array substrate is detected to be disconnected, respectively performing a laser dot fusion process at positions on the array substrate corresponding to two ends of a position of the peripheral layout gate where a disconnection occurs, so that a third repairing line corresponding to the PLG and the PLG are fused together, wherein the third repairing line and the data lead line are disposed in a same layer and at a position corresponding to the PLG An embodiment of the present invention further provides a display device, and the display device comprises the above-mentioned array substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
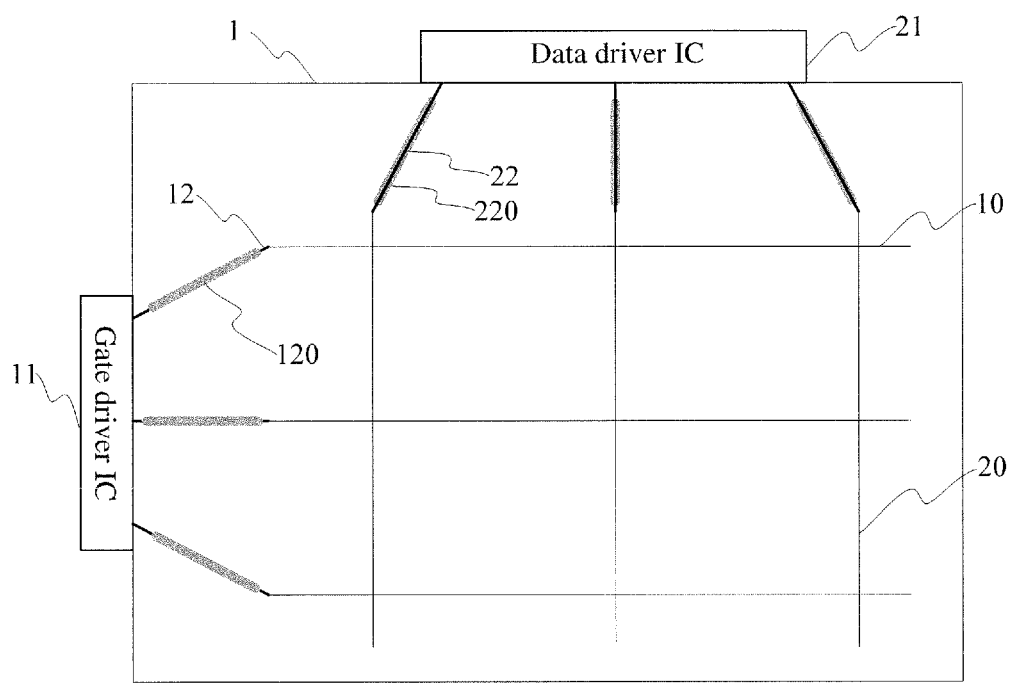
FIG. 1 is a schematic top view illustrating the structure of an array substrate of a first embodiment provided by the present invention.

In the embodiments of the present invention, via first repairing lines disposed in a same layer as gate lead lines and at positions corresponding to data lead lines, and/or, second repairing lines disposed in a same layer as the data lead lines and at positions corresponding to the gate lead lines, a gate lead line and/or a data lead line that suffers from a disconnection can be repaired timely, so as to resolve the problem that a gate lead line and a data lead line cannot be repaired once damaged.

An embodiment of the present invention provides an array substrate, and the array substrate comprises: a plurality of gate lines and a plurality of data lines disposed in a display region, gate lead lines disposed in a non-display region and connected to the gate lines and a gate driver IC respectively, and data lead lines disposed in the non-display region and connected to the data lines and a data driver IC respectively. The gate lead lines and the data lead line are collectively called as the display-region fan-out lines. The non-display region is disposed at the periphery of the display region.

The array substrate further comprises: at least one first repairing line disposed in a same layer as the gate lead lines and at a position corresponding to a data lead line; and/or, at least one second repairing line disposed in a same layer as the data lead lines, and at a position corresponding to a gate lead line.

Because a gate insulating layer is further disposed between the structural layer in which gate electrodes, the gate lines, the gate lead lines and the first repairing line are located, and the structural layer in which source electrodes, the data lines, the data lead lines and the second repairing line are located, no interference is produced between the above-mentioned metal wiring of the two structural layers. The above-mentioned metal wirings of the above-mentioned structural layers can be prepared with a same or different metallic material(s).

In the embodiment of the present invention, a first repairing line is further disposed in the structural layer where the gate lead lines are located and at a position corresponding to a data lead line, so when the data lead line suffers from a disconnection, repair for the data lead line can be performed with the first repairing line corresponding to the position of the data lead line where the disconnection occurs, so that driving signals of a data driver IC can be transmitted to the corresponding data line through the data lead line that suffers from the disconnection and its corresponding first repairing line.

Or, in the embodiment of the present invention, the second repairing line is further disposed in the structural layer where the data lead lines are located and at a position corresponding to a gate lead line, so when the gate lead line suffers from a disconnection, repair for the gate lead line can be performed with the second repairing line corresponding to the position of the gate lead line where the disconnection occurs, so that driving signals of a gate driver IC can be transmitted to the corresponding gate lines through the gate lead line that suffers from the disconnection and its corresponding the second repairing line.

For example, each first repairing line corresponds to a respective data lead line, namely, the number of the first repairing lines is equal to the number of the data lead lines, and the first repairing lines and the data lead lines correspond to each other in a one-to-one manner.

In order to not change the current structure of the data driver IC, for example, the two ends of each first repairing line are provided as dangling states, namely, the two ends of each first repairing line are not connected to any structure; and in a dangling state, the first repairing line that is not used does not affect the rest structures.

It is to be noted that, in the embodiment of the present invention, it is not limit regarding the width of the first repairing line; the width of the first repairing line can be the same as that of the data lead line, greater than that of the data lead line, and further smaller than that of the data lead line. In an example, the width of the first repairing line is not greater than that of the data lead line.

For example, each second repairing line corresponds to a respective gate lead line; namely, the number of the second repairing lines is the same as that of the gate lead lines, and the second repairing lines correspond to the gate lead lines in a one-to-one manner.

In order not to change the current structure of the gate driver IC, preferably, the two ends of each second repairing line are provided as dangling states, namely, the two ends of each second repairing line are not connected to any structure; and in a dangling state, the first repairing line that is not used does not affect the rest structures.

It is to be noted that, in the embodiment of the present invention, it is not limited regarding the width of the second repairing line; the width of the second repairing line can be the same as that of the gate lead line, greater than that of the gate lead line, and further smaller than that of the gate lead line. In an example, the width of the second repairing line is not greater than that of the gate lead line.

For example, the gate lead line and its corresponding first repairing line are overlapped with each other in the direction perpendicular to a base substrate; and the data lead line and its corresponding second repairing line are overlapped with each other in the direction perpendicular to the base substrate.

Further, if the gate driver IC is directly or indirectly disposed on the array substrate, the array substrate further comprises: at least one peripheral layout gate (PLG) that is connected to the gate driver IC and an external printed circuit board respectively; and at least one third repairing line disposed in a same layer as the data lead lines and at a position corresponding to the PLG Here the external PCB is mainly used to provide various control signals to the driver IC, for example, TTL (Transistor-to-Transistor Logic) signal, low voltage differential signal (LVDS), timing control signal, and so on.

In the embodiment of the present invention, a third repairing line is disposed in the structural layer where the data lead lines is located and at a position corresponding to a PLG, so when the PLG suffers from a disconnection, repair for the PLG can be performed with the third repairing line corresponding to the position of the PLG where the disconnection occurs, so that the driving signals of the external PLG can be transmitted to the corresponding gate driver IC through the PLG that suffers from the disconnection and its corresponding third repairing line.

For example, each third repairing line corresponds to a respective PLG, namely, the number of the third repairing lines is the same as that of the PLGs, and the third repairing lines correspond to the PLGs in a one-to-one manner.

In order not to change the current structures of the gate driver IC and the external PCB, for example, the two ends of each third repairing line are provided as dangling states, namely, the two ends of each second repairing line are not connected to any structure, so that the first repairing line that is not used does not affect the rest structures.

It is to be noted that, in the embodiment of the present invention, it is not limited regarding the width of the third repairing line; the width of the third repairing line can be the same as that of the PLG, greater than that of the PLG, and further smaller than that of the PLG In an example, the width of the third repairing line is not greater than that of the PLG.

For example, the PLG and its corresponding third repairing line are overlapped with each other in the direction perpendicular to the base substrate.

In the manufacturing process and in different display devices, the data driver IC and the gate driver IC may be different in packaging methods and positions. At present, two common packaging methods for a gate driver IC and a driver IC comprise COF (Chip On Film) method and COG (Chip On Glass) method. The COF method refers to the method of packaging a gate driver IC and a data driver IC on a corresponding flexible circuit board respectively, and the COG method refers to the method of packaging a gate driver IC and a data driver IC to the corresponding positions on an array substrate respectively.

The data driver IC is usually disposed along the X direction (namely, a direction parallel to the gate lines) of a display panel. Whether the data driver IC is packaged in the COF method or the COG method, it is only required to provide the data lead lines used for connecting the data lines; but the gate driver IC is usually disposed along the Y direction (namely, a direction parallel to the data lines) of the display panel. If the gate driver IC is packaged in the COF method, it is only required to provide the gate lead lines used for connecting the gate lines on the array substrate; and if the gate driver IC is packaged in the COG method, in addition to the gate lead lines disposed on the array substrate and used for connecting the gate lines, a PLG is required, and the external PCB is connected to the gate driver IC through the PLG.

The array substrate provided by the embodiments of the present invention can be applied to various TFT-LCD display panels, such as twisted nematic (TN) type, fringe field switching (FFS) type, in-plane switching (IPS) type, or vertical alignment (VA) type display panel.

With respect to the drawings, the structure of the array substrate provided by the embodiments of the present invention will be described in detail in the following.

First Embodiment

In this embodiment, both the gate driver IC and the data driver IC of a display device are packaged in the COF method. The structure of the array substrate provided by this embodiment is illustrated in FIG. 1.

In the display region of the array substrate 1, a plurality of gate lines 10 and a plurality of data lines 20 are provided, and in the peripheral region, a gate driver IC 11 and a data driver IC 21 are provided. The gate lines 10 and the gate driver IC 11 are connected with each other via gate lead lines 12 that are disposed in a same layer as the gate lines 10; and the data line 20 and the data driver IC 21 are connected with each other via data lead lines 22 that are disposed in a same layer as the data lines 20.

In the structural layer where the gate lines 10 of the array substrate and the gate lead lines 12 are located, first repairing lines 220 are further disposed at positions corresponding to the data lead lines 22, and the first repairing lines 220 are used when any one of the data lead lines 22 suffers from a disconnection so as to timely repair the data lead line 22 that occurs the disconnection. The data lead lines 22 and the corresponding first repairing lines 220 are overlapped with each other in the direction perpendicular to the base substrate.

In the structural layer where the data lines 20 of the array substrate and the data lead line 22 are located, second repairing lines 120 are further disposed at positions corresponding to the gate lead lines 12, and the second repairing lines 120 are used when any one of the gate lead lines 12 suffers from a disconnection so as to timely repair the gate lead line 12 that occurs the disconnection. The gate lead lines 12 and the corresponding second repairing lines 120 are overlapped with each other in the direction perpendicular to the base substrate.

It is to be noted that, the thicknesses of the respective wires in FIG. 1 are schematically used to help to differentiate different signal lines only, and do not represent their real widths.

Second Embodiment

Figure 2:
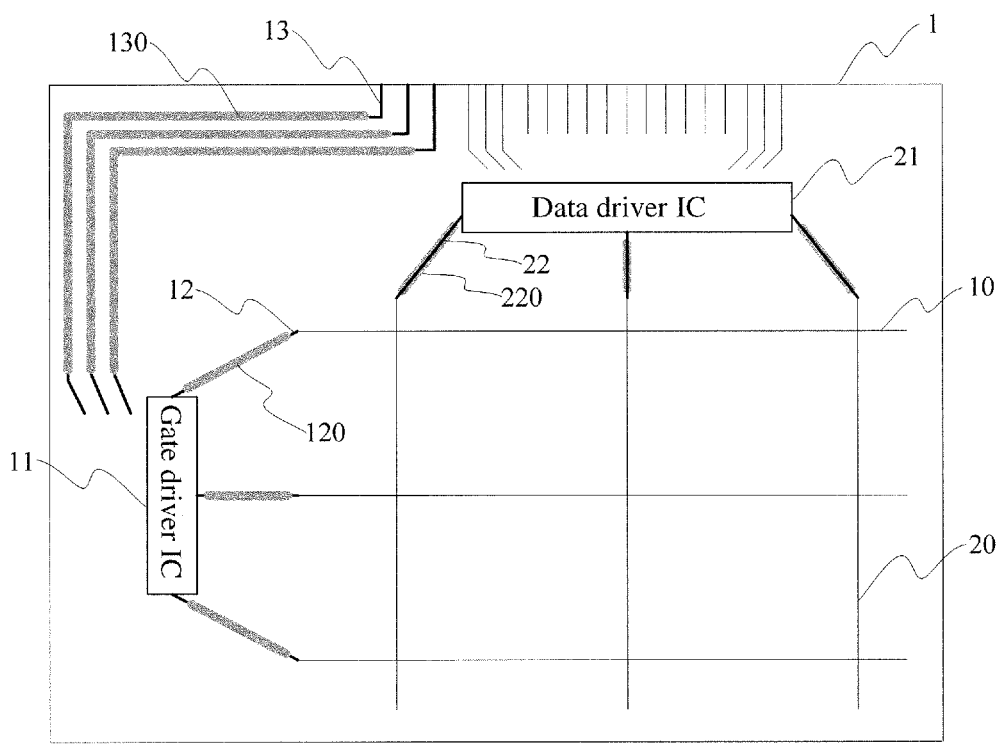
FIG. 2 is a schematic top view illustrating the structure of an array substrate of a second embodiment provided by the present invention.

In this embodiment, both the gate driver IC and the data driver IC of the display device are packaged in the COG method. The structure of the array substrate provided by this embodiment is illustrated in FIG. 2.

In the display region of the array substrate 1, a plurality of gate lines 10 and a plurality of data lines 20 are provided, and in the peripheral region, the gate driver IC 11 and the data driver IC 21 are provided. The gate lines 10 and the gate driver IC 11 are connected with each other via gate lead lines 12 that are disposed in a same layer as the gate lines 10; and the data lines 20 and the data driver IC 21 are connected with each other via data lead lines 22 that are disposed in a same layer as the data lines 20, and the gate driver IC 11 are connected with an external PCB through a PLG 13.

In the structural layer where the gate lines 10 of the array substrate and the gate lead lines 12 are located, first repairing lines 220 are further disposed at positions corresponding to the data lead lines 22, and the first repairing lines 220 are used when any one of the data lead lines 22 suffers from a disconnection so as to timely repair the data lead line 22 that suffers from the disconnection.

In the structural layer where the data lines 20 of the array substrate and the data lead lines 22 are located, second repairing lines 120 are further disposed at positions corresponding to the gate lead lines 12, and the second repairing lines 120 are used when any one of the gate lead lines 12 suffers from a disconnection so as to timely repair the gate lead line 12 that suffers from the disconnection.

In the structural layer where the data lines 20 of the array substrate and the data lead lines 22 are located, third repairing lines 130 are further disposed at positions corresponding to PLGs 13, and the third repairing lines 130 are used when any one of the PLGs 13 suffers from a disconnection so as to timely repair the PLG 13 that suffers from the disconnection. The PLGs 13 and the corresponding third repairing lines 130 are overlapped with each other in the direction perpendicular to the base substrate.

It is to be noted that, the thicknesses of the respective wires in FIG. 2 are schematically used to help to differentiate different signal lines only, and do not represent their real widths.

Based on the array substrate provided by the embodiments of the present invention (for example, the above-mentioned first and second embodiments), an embodiment of the present invention further provides a repairing method of an array substrate.

When any one of the data lead lines of the array substrate is detected to be disconnected, a laser dot fusion process is respectively performed at the positions on the array substrate corresponding to the two ends of the position of the data lead line where the disconnection occurs, so that the first repairing line corresponding to the data lead line and the data lead line are fused together, and then the driving signals of the data driver IC can be transmitted to the corresponding data line through the data lead line that suffers from the disconnection and the first repairing line fused together with the data lead line. Here, the first repairing lines and the gate lead lines of the array substrate are disposed in a same layer and at positions corresponding to the data lead lines.

Or, when any one of the gate lead lines of the array substrate is detected to be disconnected, a laser dot fusion process is respectively performed at the positions on the array substrate corresponding to the two ends of the position of the gate lead line where the disconnection occurs, so that the second repairing line corresponding to the gate lead line and the gate lead line are fused together, and then the driving signals of the gate driver IC can be transmitted to the corresponding gate line through the gate lead line that suffers from the disconnection and the second repairing line that is fused together with the gate lead line. Here, the second repairing lines and the data lead lines of the array substrate are disposed in a same layer and at positions corresponding to the gate lead lines.

Or, further, when any one of the PLGs of the array substrate is detected to be disconnected, a laser dot fusion process is respectively performed at the positions on the array substrate corresponding to the two ends of the position of the PLG where the disconnection occurs, so that the third repairing line corresponding to the PLG and the PLG are fused together, and then the signals of an external PCB can be transmitted to the corresponding gate driver IC through the PLG that suffers from the disconnection and the third repairing line that is fused together with the PLG Here, for example, the third repairing lines and the data lead lines of the array substrate are disposed in a same layer and at positions corresponding to the PLGs.

With respect to the drawings, the repairing method of the array substrate provided by the embodiment of the present invention will be described in detail in the following.

Third Embodiment

Figure 3:
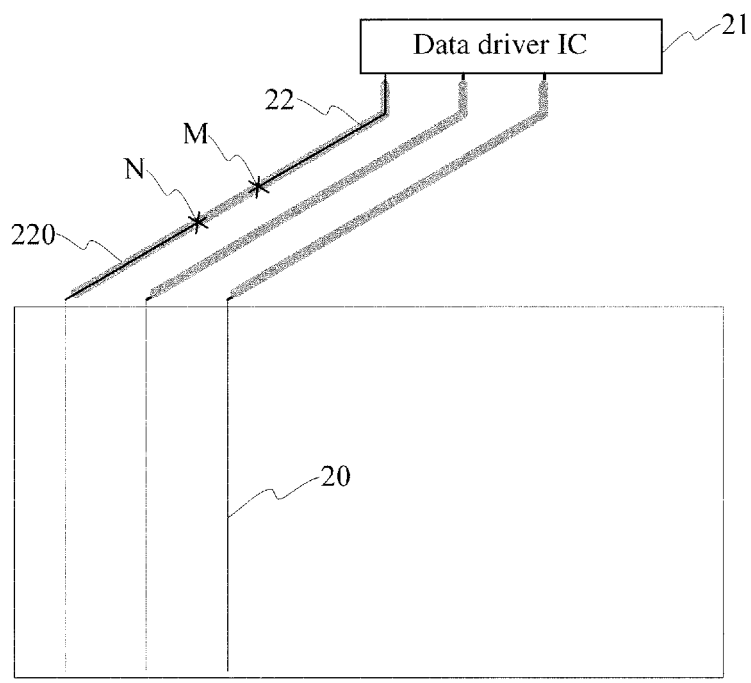
FIG. 3 is a schematic view illustrating the repair for an array substrate of a third embodiment provided by the present invention.

In this embodiment, a data lead line 22 used for connecting a data line 20 and the data driver IC 21 is detected to be disconnected, as illustrated in FIG. 3; and the repairing method for the data lead line 22 that suffers from the disconnection is as follows.

A laser dot fusion process is respectively performed at the positions corresponding to the two ends (M end and N end) of the position of the data lead line where the disconnection occurs, so that the first repairing line 220 corresponding to the data lead line and the metallic material of the data lead line 22 are fused together, and then the driving signals of the data driver IC 21 can be transmitted to the corresponding data line 20 through the data lead line 22 that suffers from the disconnection and the first repairing line 220 that is fused together with the data lead line 22.

It is to be noted that, the thicknesses of the data lead line and the first repairing line in FIG. 3 are used to help to differentiate different lines only, and do not represent their real widths.

The repairing method for the gate lead line when the gate lead line suffers from a disconnection is similar to the repairing method for the data lead line when the data lead line suffers from a disconnection, so examples for descriptions are omitted herein.

Fourth Embodiment

Figure 4:
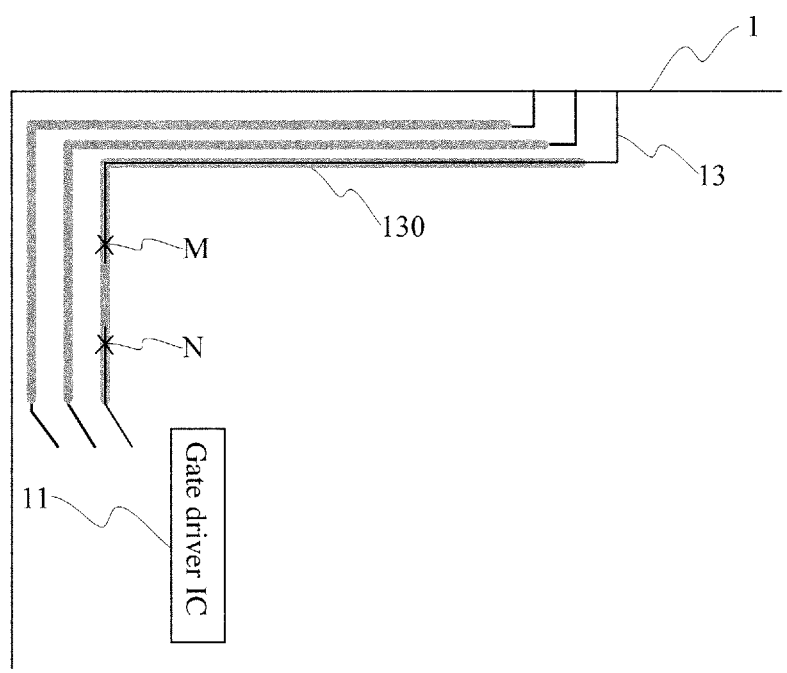
FIG. 4 is a schematic view illustrating the repair for an array substrate of a fourth embodiment provided by the present invention.

In this embodiment, a PLG 13 on the array substrate 1 and used for connecting an external PCB and the gate driver IC 11 suffers from a disconnection, as illustrated in FIG. 4, and the repairing method of the PLG 13 that suffers from the disconnection is as follows.

A laser dot fusion process is respectively performed at the positions corresponding to the two ends (M end and N end) of the PLG 13 where the disconnection occurs, so that the third repairing line 130 corresponding to the PLG and the metallic material of the PLG 13 are fused together, and then the signals of the external PCB can be transmitted to the corresponding gate driver IC 11 through the PLG 13 that suffers from the disconnection and the third repairing line 130 that is fused together with the PLG 13.

It is to be noted that, the thicknesses of the PLG and the third repairing line in FIG. 4 are used to help to differentiate different lines only, and do not represent their real widths.

Based on the array substrate provided by the embodiments of the present invention (for example, the above-mentioned first and second embodiments), an embodiment of the present invention further provides a manufacturing method of the array substrate, and the method can comprise the following steps.

Step 51, a layer of gate metal is deposited on a base substrate (for example, a glass substrate), and with one patterning process, gate electrodes of TFTs and gate lines are formed in a display region, and gate lead lines and first repairing lines are formed in a non-display region. The first repairing lines are disposed at positions corresponding to the data lead lines, each with two ends thereof dangling.

For example, the gate metal layer is deposited by using a sputtering process, and the gate electrodes, the gate lines, the gate lead lines and the first repairing lines are formed with a mask and a wet etching process.

In an embodiment, the gate driver IC is packaged in the COG method, and step 51 can comprise the processes in which a layer of gate metal is deposited on a base substrate (for example, a glass substrate or plastic substrate), and with one patterning process, gate electrodes of TFTs and gate lines are formed in a display region, and gate lead lines, PLGs and first repairing lines are formed in a non-display region.

Step 52, a gate insulating layer (GI) thin film is deposited on the base substrate subsequent to step 51 so as to form a gate insulating layer, and the gate insulating layer has the function of protecting the respective structures formed in step 51, and making the respective structures formed in step 51 insulated from the structures of the rest layers.

For example, the gate insulating layer thin film is deposited by using a sputtering process.

Step 53, an active layer thin film (for example, amorphous silicon) is deposited on the base substrate subsequent to step 52, and with one patterning process, an active layer of each TFT is formed in the display region.

For example, the active layer thin film is deposited by using the plasma enhanced chemical vapor deposition (PECVD) method, and the active layer is formed with a mask and wet etching process.

Step 54, a source/drain (S/D) metal thin film is deposited on the base substrate subsequent to step 53, and with one patterning process, source/drain electrodes of TFTs and data lines are formed in the display region, and data lead lines and second repairing lines are formed in the non-display region. The second repairing lines are disposed at positions corresponding to the gate lead lines, each with two ends thereof dangling.

For example, the S/D metal layer is deposited by using a sputtering process, and the source/drain electrodes, the data lines, the data lead lines and the second repairing lines are formed with a mask and wet etching process.

In an example, the gate driver IC is packaged in the COG method, and step 54 can comprise the processes in which: a S/D metal thin film is deposited on the base substrate subsequent to step 53, and with one patterning process, source/drain electrodes of TFTs and data lines are formed in the display region, and data lead lines, second repairing lines and third repairing lines are formed in the non-display region. The second repairing lines are disposed at positions corresponding to the gate lead lines, each with two ends thereof disposed dangling; and the third repairing lines are disposed at positions corresponding to the PLGs, each with two ends thereof dangling.

Step 55, an insulating-protection layer and a pixel electrode layer are successively formed on the base substrate subsequent to step 54.

For example, the pixel electrode can be prepared with a conductive material such as tin indium oxide (ITO), Indium zinc oxide (IZO) or indium gallium zinc oxide (IGZO).

It is to be noted that, the manufacturing processes of the insulating-protection layer, the pixel electrode layer and the subsequent structural layer are similar to the preparation of the existing array substrate, so detailed descriptions are omitted herein.

Figure 5:
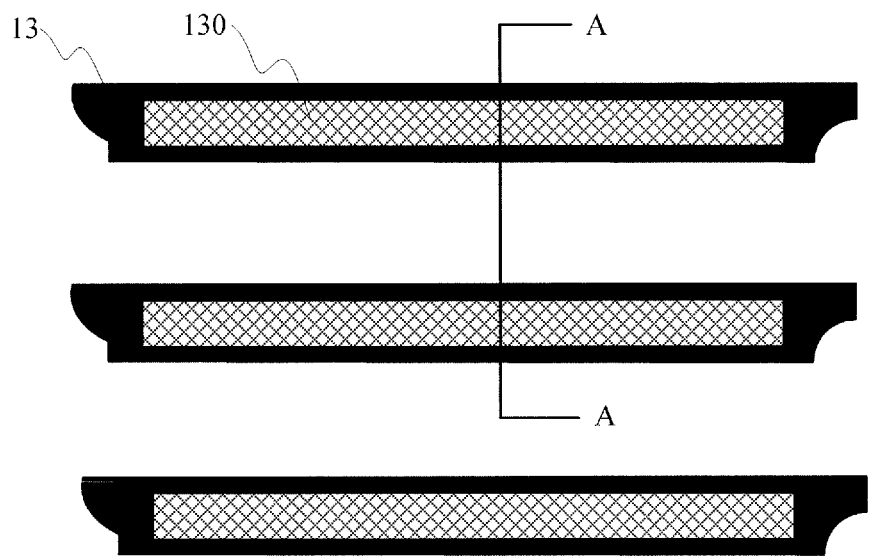
FIG. 5 is a schematic top view illustrating part of the structure of an array substrate provided by an embodiment of the present invention.

FIG. 5 illustrates a top view for part of the structures of the PLGs in the array substrate and the third repairing lines corresponding to the PLGs. As illustrated in FIG. 5, the array substrate comprises PLGs 13 that are provided in the non-display region and in a same layer as the gate lead lines, as well as a third repairing lines 130 that are provided in a same layer as the data lead lines and at positions corresponding to the PLGs 13. The PLGs 13 are used for connecting an external PCB and a gate driver IC, and the third repairing lines 130 are used for repairing the PLGs 13 when the PLGs 13 suffer from a disconnection. Each PLG 13 corresponds to one third repairing line 130.

Figure 6:
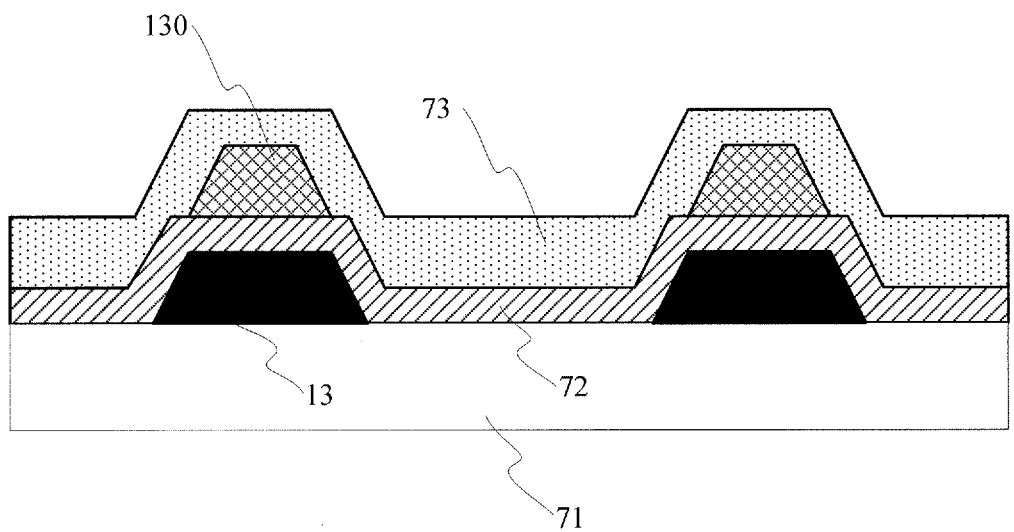
FIG. 6 is a schematic cross-sectional view of the structure of the array substrate illustrated in FIG. 5 taken along the A-A direction.

FIG. 6 illustrates a cross-sectional view of FIG. 5 taken along the A-A direction, and the array substrate illustrated in FIG. 6 successively comprises a base substrate 71, PLGs 13, a gate insulating layer 72, third repairing lines 130 and an insulating-protection layer 73.

It is to be noted that, the partial structure view of the gate lead line in the array substrate and its corresponding second repairing line, and the partial structure view of the data lead line and its corresponding first repairing line, are similar to the partial structure view of the data lead line in the abovementioned array substrate and its corresponding first repairing line, so examples for descriptions are omitted herein.

In the above-mentioned embodiments, the gate lead lines (and the first repairing lines) and the data lead lines (and the second repairing lines) are formed in different layers on the base substrate form bottom to up. But, the present invention is not limited to the sequence, and it is possible that the data lead lines (the second repairing lines) and the gate lead lines (the first repairing lines) are formed on the base substrate from bottom to up.

An embodiment of the present invention further provides a display device, and the display device comprises the array substrate provided by the embodiments of the present invention.

The preferred embodiments are described above, but a person skilled in the art may make other variations and modifications on the basis of the essential inventive step concept. Therefore, the claims are intended to be explained as all the variations and modifications that comprise the preferred embodiments and those within the scope of the present invention.

The invention claimed is:

1. An array substrate, comprising:
a plurality of gate lines and a plurality of data lines, disposed in a display region;
gate lead lines, disposed in a non-display region and respectively connected to the gate lines and a gate driver integrated circuit;
data lead lines, disposed in the non-display region and respectively connected to the data lines and a data driver integrated circuit;
at least one first repairing line, disposed in a same layer as the gate lead lines, and at a position corresponding to a data lead line; and/or
at least one second repairing line, disposed in a same layer as the data lead lines, and at a position corresponding to a gate lead line.

2. The array substrate as claimed in claim 1, wherein each first repairing line corresponds to one different data lead line.

3. The array substrate as claimed in claim 2, wherein two ends of each first repairing line are disposed in a dangling state.

4. The array substrate as claimed in claim 2, wherein each second repairing line corresponds to one different gate lead line.

5. The array substrate as claimed in claim 2, wherein two ends of each second repairing line are disposed in a dangling state.

6. The array substrate as claimed in claim 2, wherein if the gate driver integrated circuit is disposed on the array substrate, the array substrate further comprises:
at least one peripheral layout gate, respectively connected to the gate driver integrated circuit and an external printed circuit board; and
at least one third repairing line, disposed in a same layer as the data lead lines, and at a position corresponding to the peripheral layout gate.

7. The array substrate as claimed in claim 6, wherein each third repairing line corresponds to one different peripheral layout gate.

8. The array substrate as claimed in claim 6, wherein two ends of each third repairing line are disposed in a dangling state.

9. The array substrate as claimed in claim 1, wherein two ends of each first repairing line are disposed in a dangling state.

10. The array substrate as claimed in claim 1, wherein each second repairing line corresponds to one different gate lead line.

11. The array substrate as claimed in claim 10, wherein if the gate driver integrated circuit is disposed on the array substrate, the array substrate further comprises:
at least one peripheral layout gate, respectively connected to the gate driver integrated circuit and an external printed circuit board; and at least one third repairing line, disposed in a same layer as the data lead lines, and at a position corresponding to the peripheral layout gate.

12. The array substrate as claimed in claim 1, wherein two ends of each second repairing line are disposed in a dangling state.

13. The array substrate as claimed in claim 1, wherein if the gate driver integrated circuit is disposed on the array substrate, the array substrate further comprises:
at least one peripheral layout gate, respectively connected to the gate driver integrated circuit and an external printed circuit board; and
at least one third repairing line, disposed in a same layer as the data lead lines, and at a position corresponding to the peripheral layout gate.

14. The array substrate as claimed in claim 13, wherein each third repairing line corresponds to one different peripheral layout gate.

15. The array substrate as claimed in claim 14, wherein two ends of each third repairing line are disposed in a dangling state.

16. The array substrate as claimed in claim 13, wherein two ends of each third repairing line are disposed in a dangling state.

17. A display device, comprising the array substrate as claimed in claim 1.

18. A repairing method of an array substrate, comprising:
when a certain data lead line of an array substrate is detected to be disconnected, respectively performing a laser dot fusion process at positions on the array substrate corresponding to two ends of a position of a data lead line where a disconnection occurs, so that a first repairing line corresponding to the data lead line and the data lead line are fused together, wherein the first repairing line and a gate lead line of the array substrate are disposed in a same layer and at a position corresponding to the data lead line; or
when a certain gate lead line of the array substrate is detected to be disconnected, respectively performing a laser dot fusion process at positions on the array substrate corresponding to two ends of a position of the gate lead line where a disconnection occurs, so that a second repairing line corresponding to the gate lead line and the gate lead line are fused together, wherein the second repairing line and the data lead line are disposed in a same layer and at a position corresponding to the gate lead line.

19. The method as claimed in claim 18, further comprising:
when a certain peripheral layout gate of the array substrate is detected to be disconnected, respectively performing a laser dot fusion process at positions on the array substrate corresponding to two ends of a position of the peripheral layout gate where a disconnection occurs, so that a third repairing line corresponding to the peripheral layout gate and the peripheral layout gate are fused together, wherein the third repairing line and the data lead line are disposed in a same layer and at a position corresponding to the peripheral layout gate.

* * * * *